(12) United States Patent
Yun et al.

(10) Patent No.: US 11,536,766 B2
(45) Date of Patent: Dec. 27, 2022

(54) TEST BOARD HAVING SEMICONDUCTOR DEVICES MOUNTED AS DEVICES UNDER TEST AND TEST SYSTEM INCLUDING THE TEST BOARD

(71) Applicant: SAMSUNG ELECTRONICS CO., LTD., Suwon-si (KR)

(72) Inventors: Joosung Yun, Suwon-si (KR); Soonil Kwon, Suwon-si (KR); Jihyun Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 288 days.

(21) Appl. No.: 16/710,549

(22) Filed: Dec. 11, 2019

(65) Prior Publication Data
US 2020/0379035 A1    Dec. 3, 2020

(30) Foreign Application Priority Data
May 28, 2019  (KR) .................. 10-2019-0062588

(51) Int. Cl.
*G01R 31/28* (2006.01)

(52) U.S. Cl.
CPC ..... *G01R 31/2879* (2013.01); *G01R 31/2863* (2013.01); *G01R 31/2867* (2013.01)

(58) Field of Classification Search
CPC ... G01R 31/08; G01R 1/0458; G01R 31/2884
See application file for complete search history.

(56) References Cited

U.S. PATENT DOCUMENTS

| | | | |
|---|---|---|---|
| 5,999,007 A | 12/1999 | Kimura | |
| 6,140,829 A * | 10/2000 | Sharpes | G01R 31/2879 324/756.07 |
| 7,345,495 B2 | 3/2008 | Dangelo et al. | |
| 9,281,081 B1 | 3/2016 | Kang | |
| 9,520,203 B2 | 12/2016 | Lee et al. | |
| 9,721,626 B2 | 8/2017 | Kang | |
| 10,276,257 B2 | 4/2019 | Han | |
| 2005/0174137 A1* | 8/2005 | DeVey | G01R 31/31924 324/756.06 |
| 2010/0244882 A1 | 9/2010 | Choi | |
| 2018/0040383 A1 | 2/2018 | Han et al. | |

(Continued)

FOREIGN PATENT DOCUMENTS

| JP | 2001-228210 | 8/2001 |
|---|---|---|
| JP | 5000536 | 8/2012 |
| JP | 2014-169964 | 9/2014 |

(Continued)

*Primary Examiner* — Tung X Nguyen
(74) *Attorney, Agent, or Firm* — F. Chau & Associates, LLC

(57) ABSTRACT

A test board includes a board substrate, a connector at a side of the board substrate, a plurality of device-under-test (DUT) boards which are connected to the board substrate and on which semiconductor devices are mounted as DUTs, and a plurality of DC-DC converters connected to the plurality of DUT boards. The plurality of DC-DC converters convert an input voltage supplied thereto via the connector into operating voltages, and provide the operating voltages to the semiconductor devices on the plurality of DUT boards corresponding thereto. The operating voltages are substantially the same.

18 Claims, 11 Drawing Sheets

(56) References Cited

U.S. PATENT DOCUMENTS

2018/0109184 A1* 4/2018 Lee .................. H02M 3/02

FOREIGN PATENT DOCUMENTS

| | | |
|---|---|---|
| JP | 2017-072543 | 4/2017 |
| KR | 20-0213194 | 11/2000 |
| KR | 10-0826293 | 4/2008 |
| KR | 10-2009-0107769 | 10/2009 |
| KR | 10-2010-0052295 | 5/2010 |
| KR | 10-1027338 | 3/2011 |
| KR | 10-1463607 | 11/2014 |
| KR | 10-2015-0133345 | 11/2015 |
| KR | 10-2016-0056755 | 5/2016 |
| KR | 10-2016-0056756 | 5/2016 |
| KR | 10-2018-0016851 | 2/2018 |
| KR | 10-2018-0067277 | 6/2018 |

* cited by examiner

TEST BOARD HAVING SEMICONDUCTOR DEVICES MOUNTED AS DEVICES UNDER TEST AND TEST SYSTEM INCLUDING THE TEST BOARD

CROSS-REFERENCE TO RELATED APPLICATION

This application claims priority under 35 U.S.C. § 119 to Korean Patent Application No. 10-2019-0062588, filed on May 28, 2019 in the Korean Intellectual Property Office, the disclosure of which is incorporated by reference herein in its entirety.

TECHNICAL FIELD

Exemplary embodiments of the inventive concept relate to a test board and a test system for a semiconductor device, and more particularly, to a test board on which a plurality of semiconductor devices are mounted as devices under test (DUTs), and a test system including the same.

DISCUSSION OF RELATED ART

In accordance with the rapid development of the electronics industry and increasing user demand, electronic products are being developed to be more compact and have high-performance functions and large capacity. Thus, tests to be conducted on semiconductor devices in electronic products are becoming more complicated. For example, tens or hundreds of semiconductor devices can be tested simultaneously as devices under test (DUTs) in a test environment.

SUMMARY

According to an exemplary embodiment of the inventive concept, a test board includes a board substrate, a connector at a side of the board substrate, a plurality of device-under-test (DUT) boards which are connected to the board substrate and on which semiconductor devices are mounted as DUTs, and a plurality of DC-DC converters connected to the plurality of DUT boards. The plurality of DC-DC converters convert an input voltage supplied thereto via the connector into operating voltages, and provide the operating voltages to the semiconductor devices on the plurality of DUT boards corresponding thereto. The operating voltages are substantially the same.

According to an exemplary embodiment of the inventive concept, a test board includes a board substrate including a substrate base, a connector provided at a side of the board substrate, a transmission line provided on the substrate base and connected to the connector, a plurality of device-under-test (DUT) boards provided on an upper surface of the substrate base along the transmission line, semiconductor devices mounted on the plurality of DUT boards as DUTs, a plurality of DC-DC converters configured to convert an input voltage, which is supplied thereto via the transmission line, into operating voltages for the semiconductor devices and provide the operating voltages to the semiconductor devices on the plurality of DUT boards, and a test controller configured to control the plurality of DC-DC converters, and provided on the upper surface of the substrate base.

According to an exemplary embodiment of the inventive concept, a test system includes test equipment including a test chamber, and a plurality of test boards configured to be supplied with an input voltage from the test equipment, and arranged in a test chamber. Each of the plurality of test boards includes a board substrate, a connector at a side of the board substrate, a plurality of device-under-test (DUT) boards which are connected to the board substrate and on which semiconductor devices are mounted as DUTs, and a plurality of DC-DC converters connected to the plurality of DUT boards. The plurality of DC-DC converters convert an input voltage supplied thereto from the test equipment via the connector into operating voltages, provide the operating voltages to the semiconductor devices on the plurality of DUT boards corresponding thereto, generate a test input to be provided to the semiconductor devices on the plurality of DUT boards, and identify whether the semiconductor devices are defective, based on test outputs of the semiconductor devices. The operating voltages are substantially the same.

According to an exemplary embodiment of the inventive concept, a test board includes a board substrate, a connector at a side of the board substrate, a plurality of device-under-test (DUT) boards which are connected to the board substrate and on which semiconductor devices are mounted as DUTs, and a plurality of DC-DC converters. The plurality of DC-DC converters convert an input voltage supplied thereto via the connector into an operating voltage, and provide the operating voltage to the semiconductor devices on the plurality of DUT boards corresponding thereto. Each of the plurality of DC-DC converters provides the operating voltage to a corresponding pair of the plurality of DUT boards. A total number of the plurality of DUT boards is greater than a total number of the plurality of DC-DC converters.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1A:
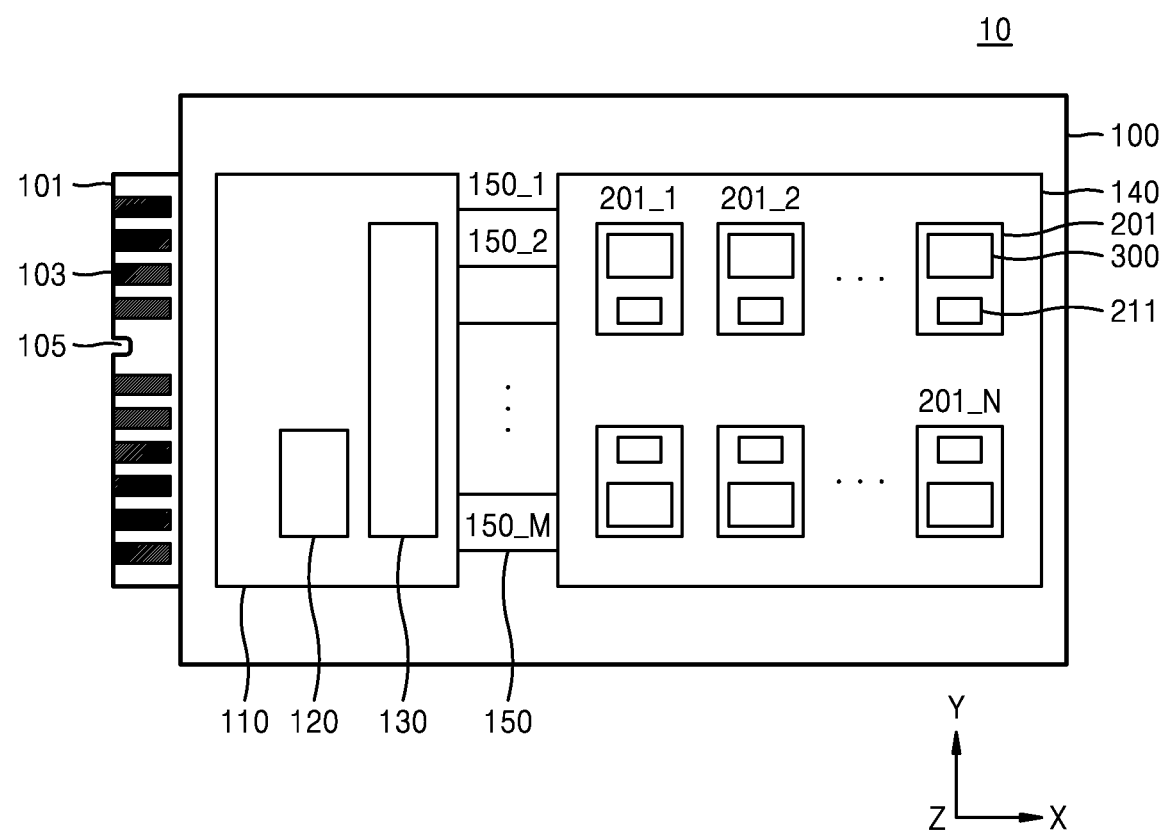
FIGS. 1A to 1C are diagrams illustrating a test board according to an exemplary embodiment of the inventive concept.

Exemplary embodiments of the inventive concept provide a test board and a test system for semiconductor devices, which are capable of simultaneously and efficiently testing a plurality of semiconductor devices as devices under test (DUTs).

Hereinafter, exemplary embodiments of the inventive concept will be described in detail with reference to the accompanying drawings. Like reference numerals may refer to like elements throughout this application.

Figure 1B:
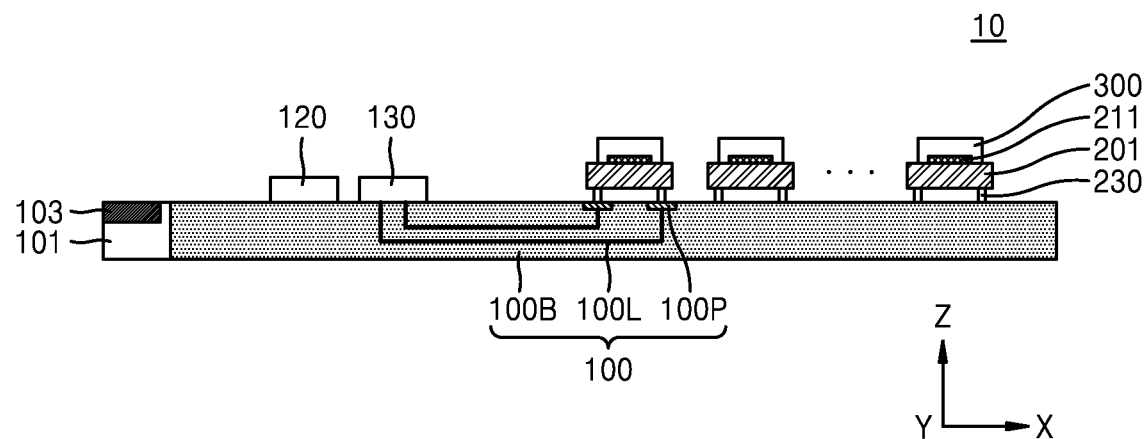
Figure 1C:
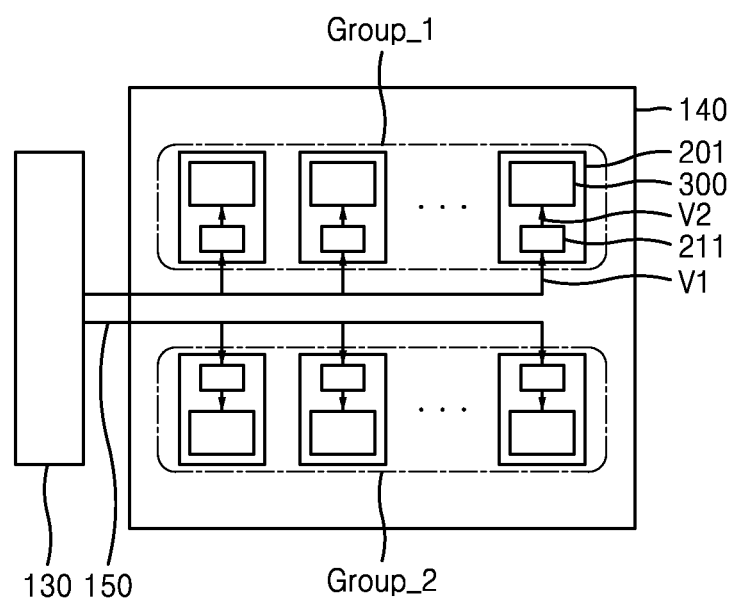

FIGS. 1A to 1C are diagrams illustrating a test board according to an exemplary embodiment of the inventive concept.

In detail, FIG. 1A is a configuration diagram illustrating a main part of a test board 10. FIG. 1B is a cross-sectional view of the test board 10. FIG. 1C is a configuration diagram illustrating setting (e.g., dividing or assigning) a plurality of device-under-test (DUT) boards 201 on the test board 10 into groups.

Referring to FIG. 1A, the test board 10 includes a board substrate 100, a connector 101 at a side of the board substrate 100, a test memory 120 and a test controller 130 on the board substrate 100, the plurality of DUT boards 201 which are connected to the board substrate 100 and on which semiconductor devices 300 are respectively mounted as DUTs, and a plurality of DC-DC converters 211 respectively connected to the plurality of DUT boards 201. In other words, the total number of the plurality of DC-DC converters 211 may be equal to that of the plurality of DUT boards 201.

The test board 10 may include a test host region 110 and a DUT board mounting region 140. Alternatively, the test board 10 may include the board substrate 100, and the board substrate 100 may include the plurality of DUT boards 201 on which DUTs are respectively mounted.

The connector 101 may be provided at the side of the board substrate 100 and include a port 103 and a recessed structure 105. The connector 101 is a means for physically connecting the test board 10 to a test system 1000 (see FIG. 4). The port 103 may include a plurality of pins, and the number, size, and arrangement of the plurality of pins may be determined based an interface connected to the test system 1000. The plurality of pins may be electrically connected to sockets included in the test system 1000. At least one recessed structure 105 may be included in the connector 101 to stably mount and fix the test board 10 on the test system 1000.

A test logic may be provided in the test host region 110. The test logic may be embodied as a semiconductor chip, such as a field programmable gate array (FPGA), an application-specific integrated circuit (ASIC), or an application processor (AP), and may transmit various information to or and receive various information from the semiconductor device 300, which is a DUT according to a parallel (or serial) communication method. For example, the test logic may be configured using an FPGA, such as Xilinx, Altera, Lattice Semiconductor, Microsemi, Achronix, QuickLogic, e2v, Atmel, or the like, but is not limited thereto.

Alternatively, the test logic may be provided on or outside the board substrate 100.

In exemplary embodiments of the inventive concept, a test input signal and/or test power (hereinafter collectively referred to as a test input) may be provided to the DUT board mounting region 140 from the test host region 110 via a plurality of transmission lines 150, and the plurality of DUT boards 201 in the DUT board mounting region 140 may receive the test inputs in parallel from the test host region 110.

The test logic may process data, or interpret and execute instructions. Through execution of a test program by the test logic, a test may be conducted, in which a signal generated by an algorithm pattern generator is input to the semiconductor device 300 to be tested, and a signal output from the semiconductor device 300 is read and compared with a predicted pattern.

The test logic may identify that the semiconductor device 300 to be tested as defective, when the output signal does not match the predicted pattern. For example, when the semiconductor device 300 is a memory device, through the test program, data generated by the algorithm pattern generator may be recorded on the semiconductor device 300, and the recorded data may be read from the semiconductor device 300 and compared with a predicted pattern.

The test memory 120 may store instructions of a test pattern or store data read from the semiconductor device 300 and a result of a test performed by the test logic. The test memory 120 may include a buffer and a storage. For example, the buffer may include a volatile memory, and the storage may include a non-volatile memory. In exemplary embodiments of the inventive concept, the buffer may include dynamic random access memory (DRAM), and the storage may include a flash memory, a solid state drive (SSD), or a hard disk drive (HDD). In exemplary embodiments of the inventive concept, the buffer may temporarily store a signal or store data read from the semiconductor device 300 and a test result to be transmitted. The storage may store instructions of a test pattern or store test results.

The test controller 130 may provide a bitstream containing one or more pieces of bit information and test power to the plurality of DUT boards 201 in the DUT board mounting region 140 by using the transmission lines 150. In particular, the test controller 130 may control the DC-DC converters 211 such that power supplied to the plurality of DUT boards 201 may be maintained at a constant level. Furthermore, the test controller 130 may control a timing at which power is supplied to the plurality of DUT boards 201. For example, the test controller 130 may allow power to be provided to the plurality of DUT boards 201 substantially simultaneously in a test environment.

Test inputs may be provided in parallel from the test host region 110 to the DUT board mounting region 140 via the transmission lines 150. In other words, the test inputs may be provided in parallel from the test host region 110 to the semiconductor devices 300 in the plurality of DUT boards 201 via the transmission lines 150.

The plurality of transmission lines 150 may include transmission lines 150_1 to 150_M and the plurality of DUT boards 201 may include DUT boards 201_1 to 201_N. The number of transmission lines 150_1 to 150_M may be the same as the number of DUT boards 201_1 to 201_N. Alternatively, the number of transmission lines 150_1 to 150_M may be greater or less than the number of DUT boards 201_1 to 201_N. For example, when one test input is provided to each of the DUT boards 201_1 to 201_N, the number of transmission lines 150_1 to 150_M may be the same as the number of DUT boards 201_1 to 201_N. However, when the DUT boards 201_1 to 201_N are classified into a plurality of groups and the same test input is provided to each of the groups, the number of transmission lines 150_1 to 150_M may be less than the number of DUT boards 201_1 to 201_N. Alternatively, when each of the DUT boards 201_1 to 201_N includes a plurality of channels communicating through independent interfaces and different test inputs are provided to the plurality of channels, the number of transmission lines 150_1 to 150_M may be greater than the number of DUT boards 201_1 to 201_N.

The plurality of DUT boards 201 may include a substrate base and a DUT socket. Depending on the shape and type of DUTs to be tested, e.g., the semiconductor devices 300, various shapes and types of DUT sockets may be provided to accommodate the DUTs. For example, the plurality of DUT boards 201 may include DUT sockets having a shape corresponding to a ball grid array (BGA), a plastic leaded chip carrier (PLCC), a plastic dual in-line package (PDIP), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), or a thin quad flat pack (TQFP), or may include universal DUT sockets to correspond to various forms. However, the DUT sockets included in the plurality of DUT boards 201 are not limited thereto.

Each of the DC-DC converters 211 may be disposed in one of the plurality of DUT boards 201. The DC-DC converter 211 may convert an input voltage V1 (see FIG. 1C) received via the transmission lines 150 into an operating voltage V2 (see FIG. 1C), and provide the operating voltage V2 to the semiconductor device 300. For example, in the case of a first DUT board 201_1, the DC-DC converter 211 may receive the input voltage V1 via a first transmission line 150_1, convert the input voltage V1 into the operating voltage V2, and provide the operating voltage V2 to the semiconductor device 300 on the first DUT board 201_1.

In other words, the DC-DC converter 211 converts the input voltage V1 into the operating voltage V2, and provides the operating voltage V2 to the semiconductor device 300, based on power supplied from the test controller 130. Thus, the plurality of DC-DC converters 211 convert the input voltage V1 supplied thereto via the connector 101 into the operating voltages V2, and provide the operating voltages V2 to the semiconductor devices 300 on the plurality of DUT boards 201 corresponding thereto. Through this operation, the operating voltage V2 obtained by the DC-DC converter 211 follows a target level. In exemplary embodiments of the inventive concept, the DC-DC converters 211, which are step-down converters, may be used to generate the operating voltage V2 having a target level, which is lower than the input voltage V1.

A test process for determining whether the semiconductor device 300 is defective may be performed in various operations of a semiconductor manufacturing process, and may include, for example, testing conducted at a wafer level and testing conducted after the wafer level. The testing conducted at the wafer level may correspond to testing conducted on individual semiconductor dies at the wafer level. The test conducted after the wafer level may be testing conducted on the semiconductor dies which are not packaged or testing conducted on a semiconductor package obtained by packaging the semiconductor dies.

Particularly, a burn-in test is a test process for checking how long the semiconductor device 300 withstands thermal stress or the like when an electrical signal is supplied to the semiconductor device 300 to operate the semiconductor device 300. In detail, the burn-in test is a test process performed to detect a defect which deteriorates over time, in which a defective semiconductor device 300 is detected in advance by applying a constant operating voltage to integrated circuits included in the semiconductor device 300, and repeatedly performing internal operations to accelerate deterioration of defective portions of the semiconductor device 300.

The semiconductor devices 300 may be devices performing various functions. In exemplary embodiments of the inventive concept, each of the semiconductor devices 300 may be a memory device including a memory cell array. For example, the memory device may be double data rate synchronous dynamic random access memory (DDR SDRAM), low power double data rate (LPDDR) SDRAM, graphics double data rate (GDDR) SDRAM, or Rambus dynamic random access memory (RDRAM). Alternatively, the memory device may be a non-volatile memory, such as a flash memory, magnetic RAM (MRAM), ferroelectric RAM (FRAM), phase change RAM (PRAM), or resistive RAM (RRAM).

The DC-DC converter 211 of each of the plurality of DUT boards 201 may convert the input voltage V1 according to the operating voltage V2 which is programmable. In exemplary embodiments of the inventive concept, each of the DUT boards 201_1 to 201_N may include the DC-DC converter 211 as a component for receiving the operating voltage V2 having a certain value. The test controller 130 may control the DC-DC converters 211 to provide the operating voltage V2 to the semiconductor devices 300 on the plurality of DUT boards 201.

Referring to FIG. 1B, the test board 10 may include the board substrate 100 and the plurality of DUT boards 201.

Each of the board substrate 100 and the plurality of DUT boards 201 may be a printed circuit board (PCB). For convenience of explanation, the board substrate 100 will be described as an example.

The board substrate 100 may include a substrate base 100B, an internal interconnection 100L in the substrate base 100B, and an electrode pad 100P in an upper surface of the substrate base 100B. The test memory 120, the test controller 130, and the plurality of DUT boards 201 may be electrically connected to the internal interconnection 100L via the electrode pad 100P.

In detail, the substrate base 100B may be formed of at least one material selected from among phenol resin, epoxy resin, and polyimide. For example, the substrate base 100B may include at least one material selected from among FR4, tetrafunctional epoxy, polyphenylene ether, epoxy/polyphenylene oxide, a bismaleimide triazine (BT), thermount, cyanate ester, polyimide, and a liquid crystal polymer. The electrode pad 100P may be formed of copper, nickel, stainless steel, or beryllium copper. The internal interconnection 100L may be formed on only one side or both sides of the substrate base 100B. In addition, three or more layers of copper foil may be formed using an insulator called prepreg, and three or more internal interconnections 100L may be formed according to the number of layers of copper foil, thus obtaining a multilayer PCB. The internal interconnection 100L may function as the plurality of transmission lines 150 (see FIG. 1A) on the board substrate 100.

The test memory 120 and the test controller 130 may be attached to the same surface of the board substrate 100. Alternatively, the test memory 120 and the test controller 130 may be attached to different surfaces of the board substrate 100.

The plurality of DUT boards 201 may be connected to the board substrate 100 via attachment and detachment members 230. The attachment and detachment members 230 may detachably attach the plurality of DUT boards 201 to the board substrate 100. In other words, the attachment and detachment members 230 may attach the plurality of DUT boards 201 to the board substrate 100 or detach the plurality of DUT boards 201 from the board substrate 100. Thus, when some of the plurality of DUT boards 201 are defective, only the defective DUT boards 201 may be replaced.

In exemplary embodiments of the inventive concept, the plurality of DUT boards 201 may be attached to the same surface of the board substrate 100 on which the test memory 120 and the test controller 130 are located. Alternatively, the plurality of DUT boards 201 may be attached to a surface of the board substrate 100, which is different from the surface of the board substrate 100 on which the test memory 120 and the test controller 130 are located.

Each of the plurality of DUT boards 201 may have an upper surface on which the semiconductor device 300 is mounted and a lower surface facing the board substrate 100. Each of the plurality of DC-DC converters 211 may be provided on the upper surface of one of the plurality of DUT boards 201. In other words, each of the DUT boards 201 may include one of the DC-DC converters 211, and the semiconductor device 300 and the DC-DC converter 211 may be attached to the same surface of the DUT board 201.

Referring to FIG. 1C, the plurality of DUT boards 201, on which the semiconductor devices 300 are respectively provided, are mounted on the test board 10 and classified into a first group Group_1 and a second group Group_2.

Although only the first and second groups Group_1 and Group_2 are illustrated in FIG. 1C, the number of groups is not limited thereto. In addition, although it is illustrated that the first and second groups Group_1 and Group_2 include the same number of DUT boards 201, the inventive concept is not limited thereto. For example, the first and second groups Group_1 and Group_2 may include different numbers of DUT boards 201. The semiconductor devices 300, on which a test is performed, may be semiconductor dies or semiconductor packages.

A test input provided from the test controller 130 via the transmission lines 150 is transmitted to a target circuit of the semiconductor devices 300. The test controller 130 may provide a test input including one or more pieces of information to the semiconductor devices 300 on the plurality of DUT boards 201 Timings at which the test input is provided to the semiconductor devices 300 on the plurality of DUT boards 201 may be substantially the same. In other words, the test controller 130 may provide the test input to the semiconductor devices 300 of the plurality of DUT boards 201 substantially simultaneously in a test environment.

Each of the plurality of DUT boards 201 may include the DC-DC converter 211. In exemplary embodiments of the inventive concept, the DC-DC converters 211 of the plurality of DUT boards 201 of the first group Group_1 may provide the operating voltage V2 to the semiconductor devices 300 independently of the input voltage V1 provided via the transmission lines 150. Similarly, the DC-DC converters 211 of the plurality of DUT boards 201 of the second group Group_2 may provide the operating voltage V2 to the semiconductor devices 300 independently of the input voltage V1 provided via the transmission lines 150.

A test logic may identify whether a pattern of the test input provided to the semiconductor device 300 matches a pattern of a test output from the semiconductor device 300 to determine whether the semiconductor device 300 is defective.

In exemplary embodiments of the inventive concept, the plurality of transmission lines 150 are provided on the board substrate 100, and the DUT boards 201 of the same group among the plurality of DUT boards 201 may be connected in parallel to one of the transmission lines 150.

The test board 10 according to an exemplary embodiment of the inventive concept is capable of simultaneously providing substantially the same operating voltages V2 to the semiconductor devices 300 on the plurality of DUT boards 201, which consume a large amount of power in a test environment. Thus, power supplied from the test system 1000 (see FIG. 4) may be used losslessly. As a result, characteristics of the semiconductor devices 300 may be prevented from being deteriorated due to a test even in an extreme test environment such as the burn-in test. In addition, because it is possible to provide substantially the same operating voltages V2 to the semiconductor devices 300 of the plurality of DUT boards 201, a test speed may be prevented from decreasing in the test environment.

In the test board 10 according to an exemplary embodiment of the inventive concept, even when overcurrent flows in some of the semiconductor devices 300 on the DUT boards 201 connected to one transmission line 150, the plurality of DC-DC converters 211 may provide substantially the same operating voltages V2 to the remaining semiconductor devices 300 on the DUT boards 201. This is because the DC-DC converters 211 are active elements unlike commonly used passive elements (e.g., a resistive element) and thus are capable of individually providing the operating voltage V2 to the semiconductor devices 300 on the DUT boards 201.

Figure 2A:
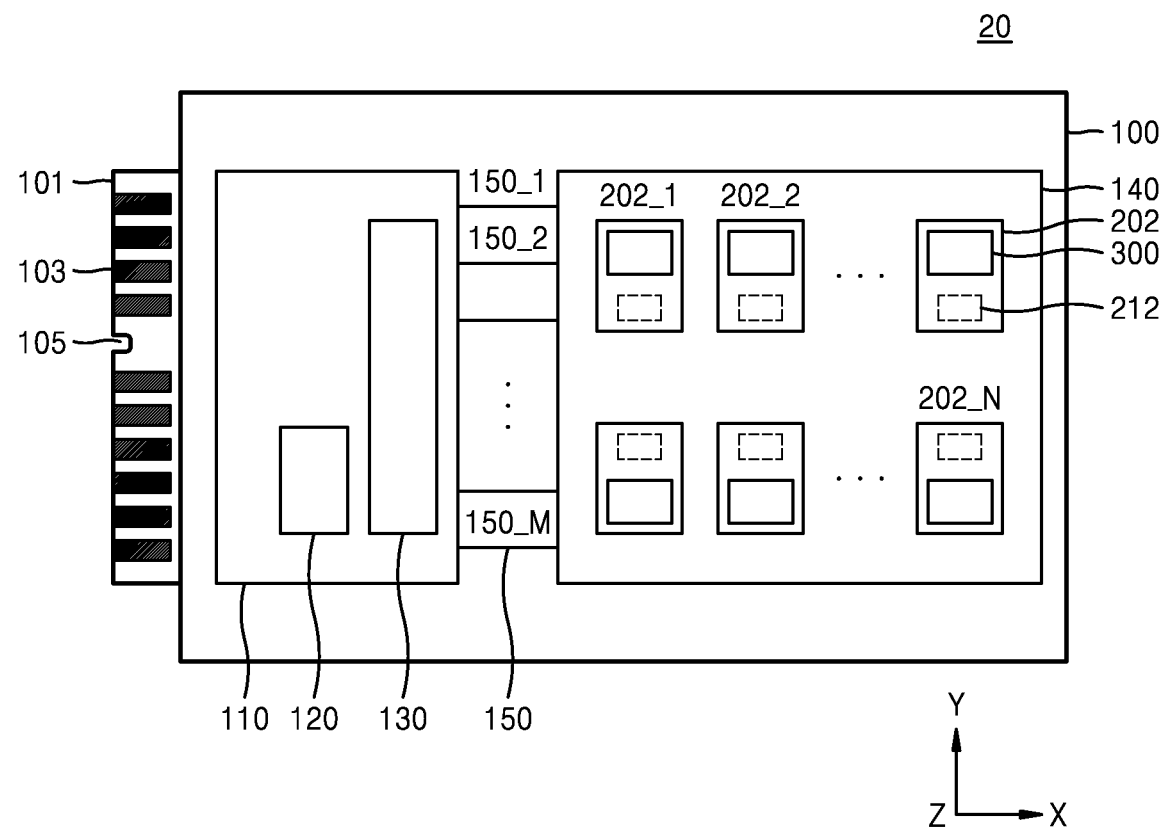
FIGS. 2A to 2C are diagrams illustrating a test board according to an exemplary embodiment of the inventive concept.
Figure 2B:
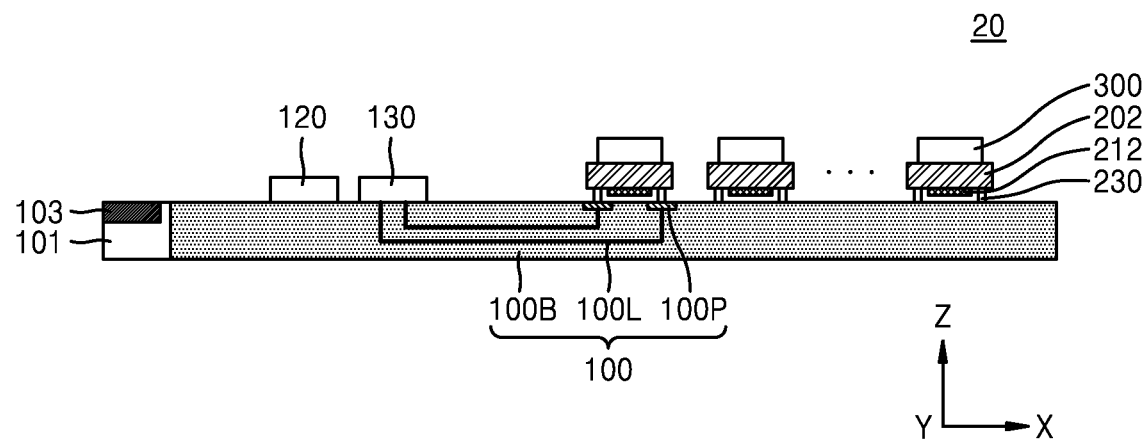
Figure 2C:
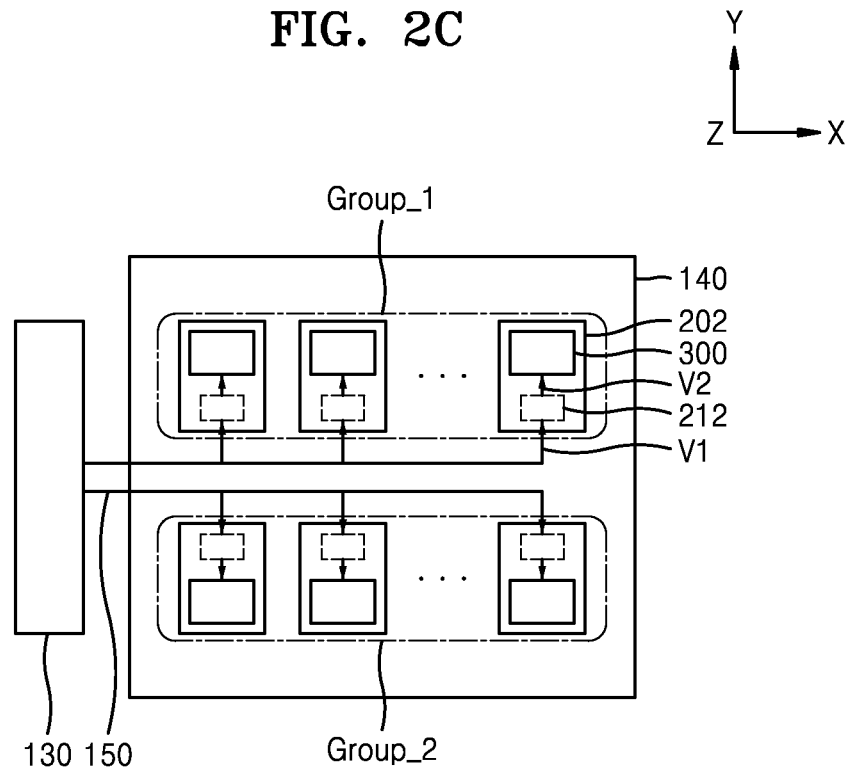

FIGS. 2A to 2C are diagrams illustrating a test board according to an exemplary embodiment of the inventive concept.

In detail, FIG. 2A is a configuration diagram illustrating a main part of a test board 20. FIG. 2B is a cross-sectional view of the test board 20. FIG. 2C is a configuration diagram illustrating setting a plurality of DUT boards 202 on the test board 20 into groups.

Most components of the test board 20 described below and materials of the components are substantially the same as or similar to those described above with reference to FIGS. 1A to 1C. Therefore, for convenience of explanation, the test board 20 will be described below focusing on differences from the test board 10 described above.

Referring to FIGS. 2A to 2C, the test board 20 includes the board substrate 100, the connector 101 at the side of the board substrate 100, the test memory 120 and the test controller 130 on the board substrate 100, a plurality of DUT boards 202 which are connected to the board substrate 100 and on which the semiconductor devices 300 are respectively mounted as DUTs, and a plurality of DC-DC converters 212 respectively connected to the plurality of DUT boards 202.

The plurality of DUT boards 202 may be connected to the board substrate 100 via attachment and detachment members 230. In exemplary embodiments of the inventive concept, the plurality of DUT boards 202 may be attached to the same surface of the board substrate 100 on which the test memory 120 and the test controller 130 are located. Alternatively, the plurality of DUT boards 202 may be attached to a surface of the board substrate 100, which is different from the surface of the board substrate 100 on which the test memory 120 and the test controller 130 are located.

Each of the plurality of DUT boards 202 has an upper surface on which the semiconductor device 300 is mounted and a lower surface facing the board substrate 100. The plurality of DC-DC converters 212 may be respectively provided on the lower surfaces of the plurality of DUT boards 202. In other words, each of the plurality of DUT boards 202 may include one of the plurality of DC-DC converters 212, and the semiconductor device 300 and the DC-DC converter 212 may be attached to different surfaces of the DUT board 202.

Because the attachment and detachment members 230 have a certain height, the plurality of DUT boards 202 may be arranged on the attachment and detachment members 230 in the form of a dolmen. Accordingly, empty spaces between the upper surface of the board substrate 100 and lower surfaces of the plurality of DUT boards 202 may be obtained, and the DC-DC converters 212 may be disposed in the empty spaces.

In this case, free spaces corresponding to planar areas of upper surfaces of the DUT boards 202, which are occupied by the DC-DC converters 212, may be obtained. Therefore, planar areas on which the semiconductor devices 300 may be mounted may be increased, and thus, the semiconductor devices 300 having a relatively large size may be mounted on the upper surfaces of the DUT boards 202.

Figure 3A:
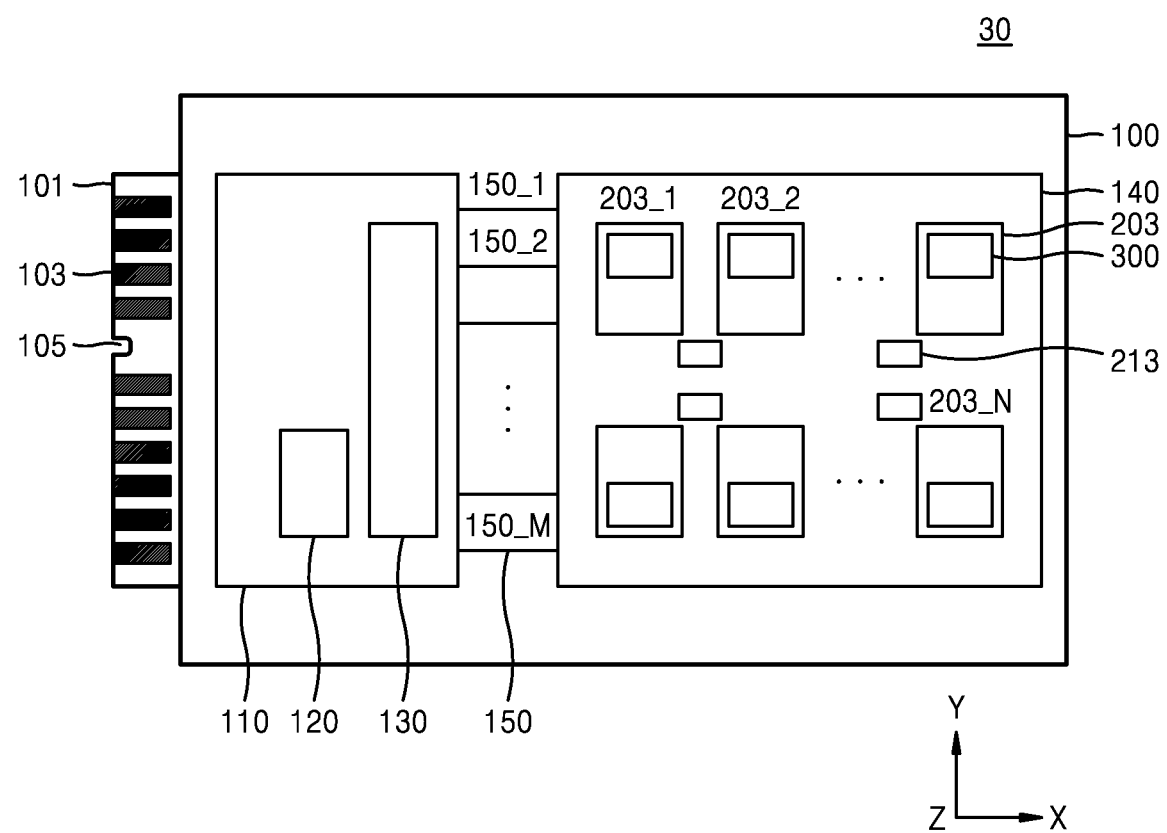
FIGS. 3A to 3C are diagrams illustrating a test board according to an exemplary embodiment of the inventive concept.
Figure 3B:
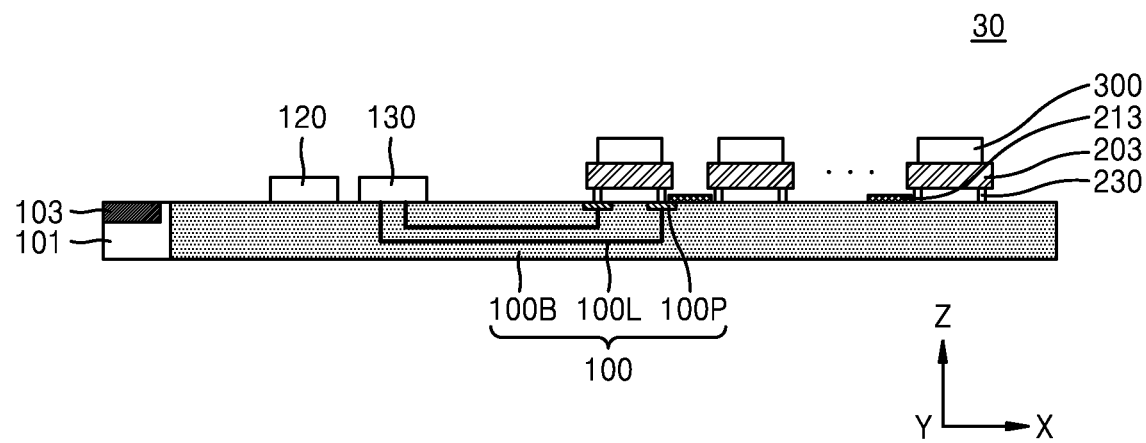
Figure 3C:
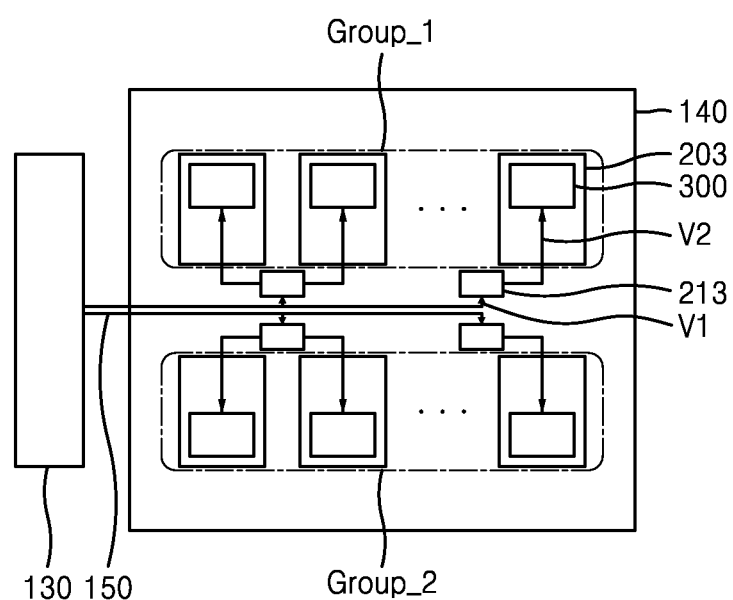

FIGS. 3A to 3C are diagrams illustrating a test board according to an exemplary embodiment of the inventive concept.

In detail, FIG. 3A is a configuration diagram illustrating a main part of a test board 30. FIG. 3B is a cross-sectional view of the test board 30. FIG. 3C is a configuration diagram illustrating setting a plurality of DUT boards 203 on the test board 30 into groups.

Most components of the test board 30 described below and materials of the components are substantially the same as or similar to those described above with reference to FIGS. 1A to 1C. Thus, for convenience of explanation, the test board 30 will be described below focusing on differences from the test board 10 described above.

Referring to FIGS. 3A to 3C, the test board 30 includes the board substrate 100, the connector 101 at the side of the board substrate 100, the test memory 120 and the test controller 130 on the board substrate 100, a plurality of DC-DC converters 213, and a plurality of DUT boards 203 which are connected to the board substrate 100 and on which the semiconductor devices 300 are mounted as DUTs.

The plurality of DUT boards 203 may be connected to the board substrate 100 via the attachment and detachment members 230. In exemplary embodiments of the inventive concept, the plurality of DUT boards 203 may be attached to the same surface of the board substrate 100 on which the test memory 120 and the test controller 130 are located. Alternatively, the plurality of DUT boards 203 may be attached to a surface of the board substrate 100, which is different from the surface of the board substrate 100 on which the test memory 120 and the test controller 130 are located.

The plurality of DUT boards 203 may be provided on an upper surface of the board substrate 100, and the plurality of DC-DC converters 213 may be provided on the upper surface of the board substrate 100 to be separated from the plurality of DUT boards 203. In other words, the plurality of DC-DC converters 213 may be provided on the upper surface of the board substrate 100 but not on the plurality of DUT boards 203. For example, each of the plurality of DC-DC converters 213 may be disposed on the upper surface of the board substrate 100 between a corresponding pair of the plurality of DUT boards 203.

In addition, one DC-DC converter 213 may be configured to provide substantially the same operating voltage to semiconductor devices 300 on at least two DUT boards 203 (e.g., the corresponding pair of the plurality of DUT boards 203). In other words, the DC-DC converters 213 are not respectively provided on the plurality of DUT boards 203. Rather, the number (e.g., total number) of DUT boards 203 may be greater than that of the DC-DC converters 213.

In other words, the plurality of DUT boards 203 may be classified into one or more groups, and each of the groups may include DC-DC converters 213, the number of which is less than that of DUT boards 203. One DC-DC converter 213 may be provided at a position at which substantially the same operating voltages V2 may be provided to the semiconductor devices 300 on at least two DUT boards 203 corresponding thereto.

In exemplary embodiments of the inventive concept, operating voltages for the DC-DC converters 213 may be set differently in units of groups. As operating voltages of the DC-DC converters 213 are set differently in units of groups, substantially the same operating voltages may be simultaneously provided to target circuits of the semiconductor devices 300 of the same group. For example, the DC-DC converters 213 of the semiconductor devices 300 of the first group Group_1 may convert a test input to substantially the same operating voltages. On the other hand, the DC-DC converters 213 of the semiconductor devices 300 of the second group Group_2 may convert the test input to substantially the same operating voltages that are different from those for the first group Group_1.

In this case, the number of DC-DC converters 213 is relatively reduced to decrease both the complexity and manufacturing costs of the internal interconnection 100L. Furthermore, free spaces corresponding to planar areas of upper surfaces of the DUT boards 203, which are occupied by the DC-DC converters 213, may be obtained. Therefore, planar areas on which the semiconductor devices 300 may be mounted may be increased, and thus, the semiconductor devices 300 having a relatively large size may be mounted on the upper surfaces of the DUT boards 203.

Figure 4:
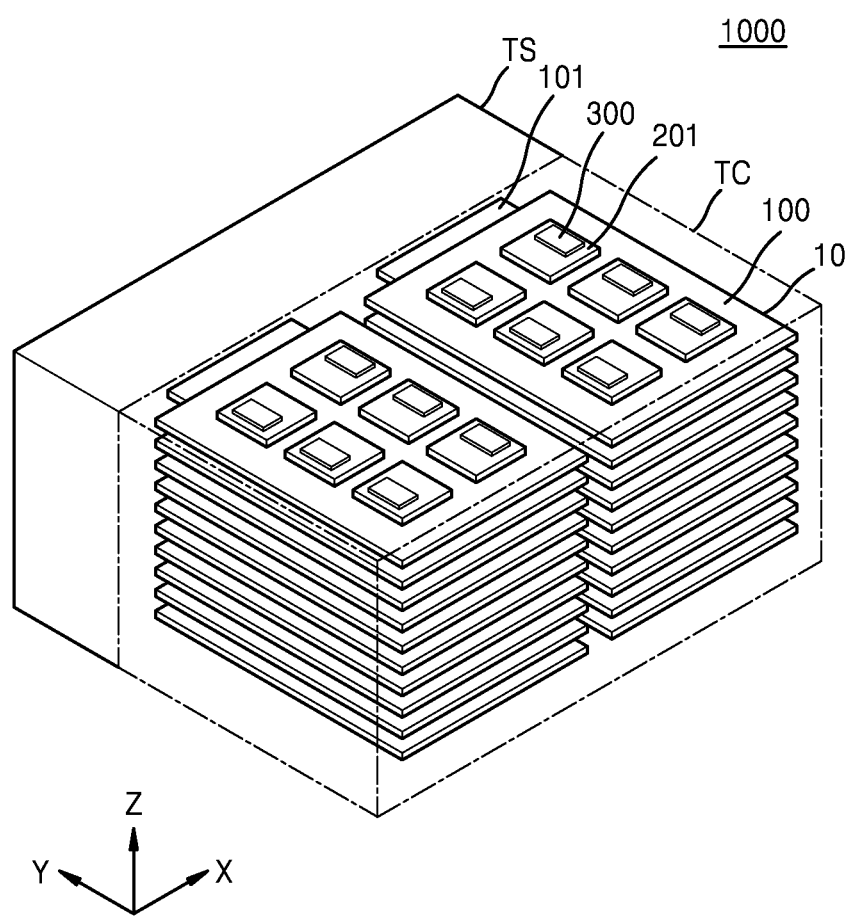
FIG. 4 is a perspective view of a test system according to an exemplary embodiment of the inventive concept.

FIG. 4 is a perspective view of a test system according to an exemplary embodiment of the inventive concept.

Referring to FIG. 4, a test system 1000 may be configured as test equipment which includes a test server TS and a test chamber TC.

The test server TS may collectively refer to a main part of the test equipment which stores a test program of the test system 1000, performs a test command, and identifies a test result.

A plurality of test boards 10 may be mounted in the test chamber TC. In exemplary embodiments of the inventive concept, each of the plurality of test boards 10 in the test chamber TC may be supplied with test power from a power supply of the test server TS via the connector 101.

The plurality of DUT boards 201 on which the semiconductor devices 300 are respectively arranged may be connected to the plurality of test boards 10. The semiconductor devices 300, which are DUTs, may be electrically connected to the plurality of test boards 10 via the plurality of DUT boards 201. The semiconductor devices 300 may be accommodated in DUT sockets and connected to the DUT boards 201. The plurality of DUT boards 201 may be arranged on the test boards 10 before the semiconductor devices 300 are accommodated in the DUT sockets.

In the test system 1000, the plurality of test boards 10 to which the semiconductor devices 300 are connected may be placed in the test chamber TC to exchange signals with the test server TS through communication and conduct a test on the semiconductor devices 300.

The test conducted on the semiconductor devices 300 may include, for example, the burn-in test, a DC test, an AC test, a function test, or the like. In detail, the burn-in test is a test for checking how long the semiconductor devices 300 withstand thermal stress or the like when an electrical signal is supplied to the semiconductor devices 300 to operate the semiconductor devices 300. For example, the test chamber TC may maintain a certain temperature for the burn-in test until test outputs are provided to the test equipment. Through the DC test, a voltage or a current is applied as a constant analog signal, and then a current generated due to the application of the voltage or a voltage generated due to the application of the current may be measured. Through the AC test, a time point at which a measured signal changes with respect to a reference signal may be measured after a voltage is mainly input as an analog signal. Through the function test, whether a logic error has occurred may be determined by inputting a digital signal that changes.

The test for the semiconductor devices 300 may be performed under a normal temperature condition, a low temperature condition, a high temperature condition, or the like, depending on a temperature set in the test chamber TC. In addition, the test for the semiconductor devices 300 may be performed under a dry condition, a high-humidity condition, or the like, depending on a humidity set in the test chamber TC. In other words, the test chamber TC may provide various temperature environments and/or various humidity environments according to a command from the test server TS.

After the test is completed, the semiconductor devices 300 connected to the plurality of DUT boards 201 may be separated. In exemplary embodiments of the inventive concept, the test server TS may divide the semiconductor devices 300 into semiconductor devices 300 that pass the test and semiconductor devices 300 that do not pass the test (in other words, semiconductor devices 300 that fail the test), and then separate the semiconductor devices 300 from the DUT boards 201. In exemplary embodiments of the inventive concept, the test server TS may divide the semiconductor devices 300 that fail the test into repairable semiconductor devices 300, semiconductor devices 300 to be re-tested, and semiconductor device 300 to be discarded, and then separate the semiconductor devices 300 from the DUT boards 201. In exemplary embodiments of the inventive concept, the semiconductor devices 300 to be re-tested may not be separated from the DUT board 201 and then may be re-tested. Alternatively, the semiconductor devices 300 to be re-tested may be separated from the DUT board 201 which has been tested and then may be connected to another DUT board 201 for re-testing.

In the test board 10 according to an exemplary embodiment of the inventive concept, substantially the same operating voltages may be simultaneously provided to the semiconductor devices 300 on the plurality of DUT boards 201, which consume a large amount of power in a test environment. Thus, power supplied from the test system 1000 may be used losslessly. As a result, characteristics of the semiconductor devices 300 may be prevented from being deteriorated due to a test even in an extreme test environment such as the burn-in test. In addition, because substantially the same operating voltages may be provided to the semiconductor devices 300 on the plurality of DUT boards 201, a test speed may be prevented from decreasing in the test environment.

Figure 5:
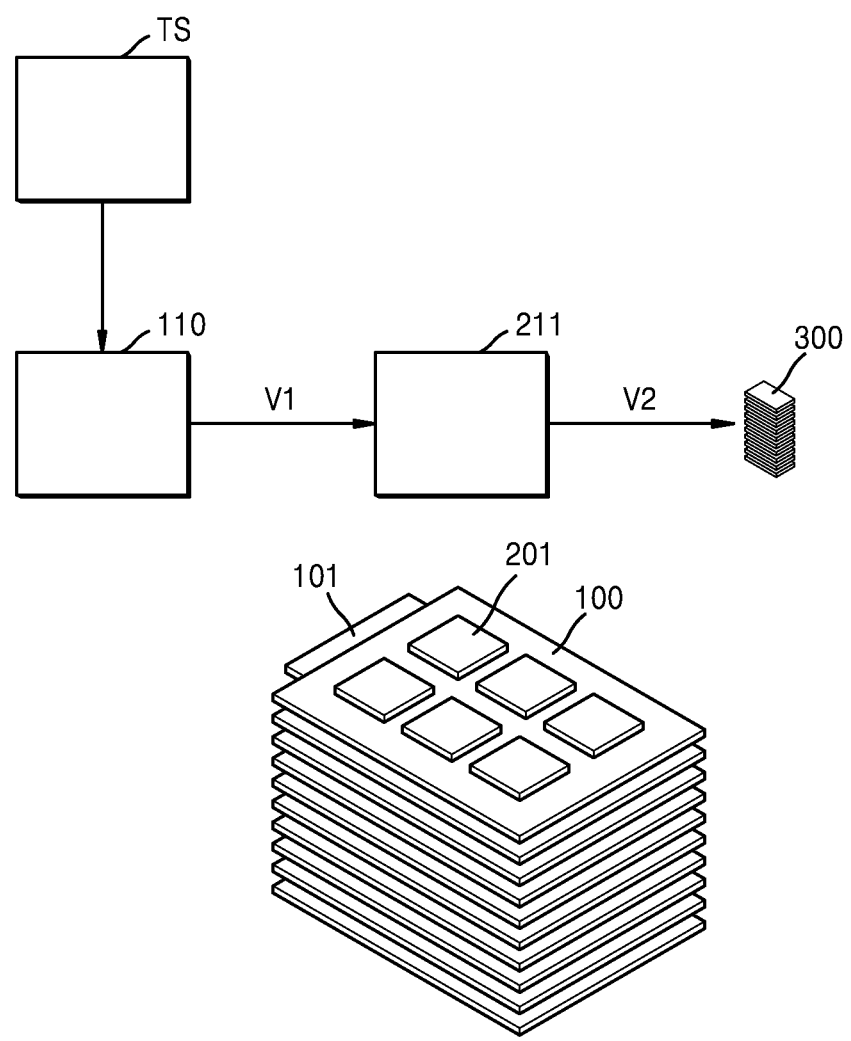
FIG. 5 is a configuration diagram illustrating a main part of a test system according to an exemplary embodiment of the inventive concept.

FIG. 5 is a configuration diagram illustrating a main part of a test system according to an exemplary embodiment of the inventive concept.

Referring to FIG. 5, test power may be supplied from the test server TS to the semiconductor devices 300 on the plurality of DUT boards 201 via the test host region 110 and the DC-DC converter 211.

The test server TS may include a power generator and a power transmitter. Test power generated by the power generator may be supplied to the test host region 110 via the power transmitter. The input voltage V1 of the test power supplied to the test host region 110 may be converted into substantially the same operating voltages V2 by the DC-DC converter 211, and the substantially the same operating voltages V2 may be provided to the semiconductor devices 300.

Through this operation, the operating voltages V2 obtained by the DC-DC converter 211 follow a target level. In exemplary embodiments of the inventive concept, a step-down DC-DC converter may be used as the DC-DC converter 211 to generate the operating voltage V2 having a target level, which is lower than the input voltage V1.

Figure 6A:
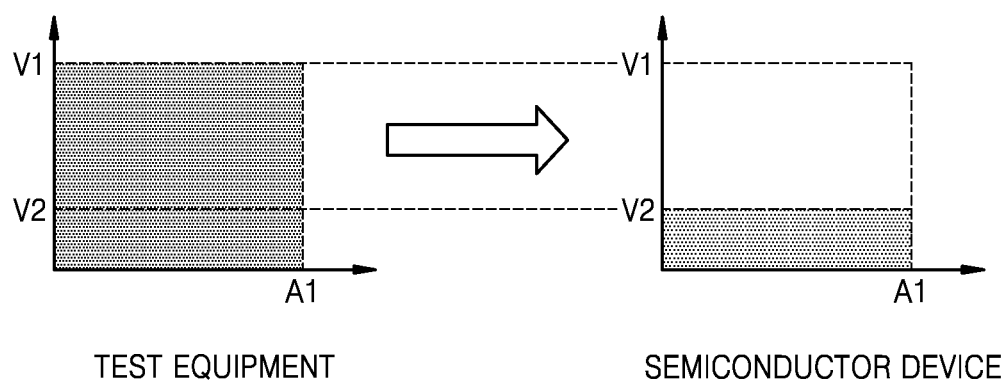
FIGS. 6A and 6B are schematic graphs showing power supplied from a test system to a device under test (DUT) according to a comparative example and an exemplary embodiment of the inventive concept.
Figure 6B:
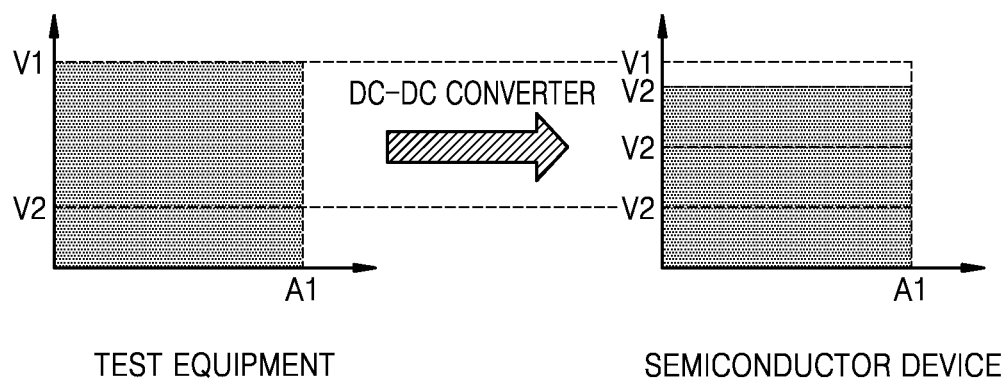

FIGS. 6A and 6B are schematic graphs showing power supplied from a test system to a DUT according to a comparative example and an exemplary embodiment of the inventive concept.

Here, the horizontal axis represents a current and the vertical axis represents a voltage. For convenience of explanation, the test system 1000 of FIG. 4 will be described together with FIGS. 6A and 6B.

FIGS. 6A and 6B are graphs for explaining how power is distributed to the semiconductor devices 300 by using the test board 10 according to an exemplary embodiment of the inventive concept. The graph of FIG. 6A shows power in a general test board in which a DC-DC converter is not mounted. The graph of FIG. 6B shows power in the test board 10 according to an exemplary embodiment of the inventive concept, in which the DC-DC converter 211 is mounted.

In the general test system, test equipment and a test board are connected to each other via a connector, and signals and power are shared via one pin due to the limited number of pins arranged in the connector. In recent years, operating voltages for semiconductor devices have been continuously reduced due to the rapid development of mobile devices, whereas operating currents have been continuously increased due to the use of semiconductor packages in which a plurality of semiconductor chips are stacked according to the demands for large-capacity memory devices. Therefore, although test equipment is capable of supplying sufficient power (A1×V1) to a test board, power (A1×V2) to be used in semiconductor devices may be limited due to a limitation on the amount of power to be transmitted to the test board via a connector. Thus, the number of semiconductor devices able to be processed by a test system decreases, requiring new test systems and reducing economic feasibility.

In contrast, the test system 1000 according to an exemplary embodiment of the inventive concept employs a method of supplying power to the semiconductor devices 300 by using the DC-DC converter 211 on the test board 10. In other words, a maximum amount of power (A1×V1) is transmitted from test equipment and then is controlled to be converted into the operating voltage V2 by the DC-DC converter 211 without being directly supplied to the semiconductor devices 300, and thus, the operating voltage V2 may be provided to the semiconductor devices 300. The DC-DC converter 211 is very economical because the unit price thereof is low, compared to the costs and time for introducing a new test system.

In addition, in the general test system, when a short circuit occurs between interconnections due to a defect of an internal circuit of a semiconductor device, an operating voltage provided to other neighboring semiconductor devices may be shaken or altered due to overcurrent.

In contrast, in the test system 1000 according to an exemplary embodiment of the inventive concept, the DC-DC converter 211 is used as an active element. Thus, even when a short circuit occurs between interconnections due to a defect of internal circuits of some of the semiconductor devices 300, substantially the same operating voltages V2 may be continuously provided to other neighboring semiconductor devices 300.

Figure 7:
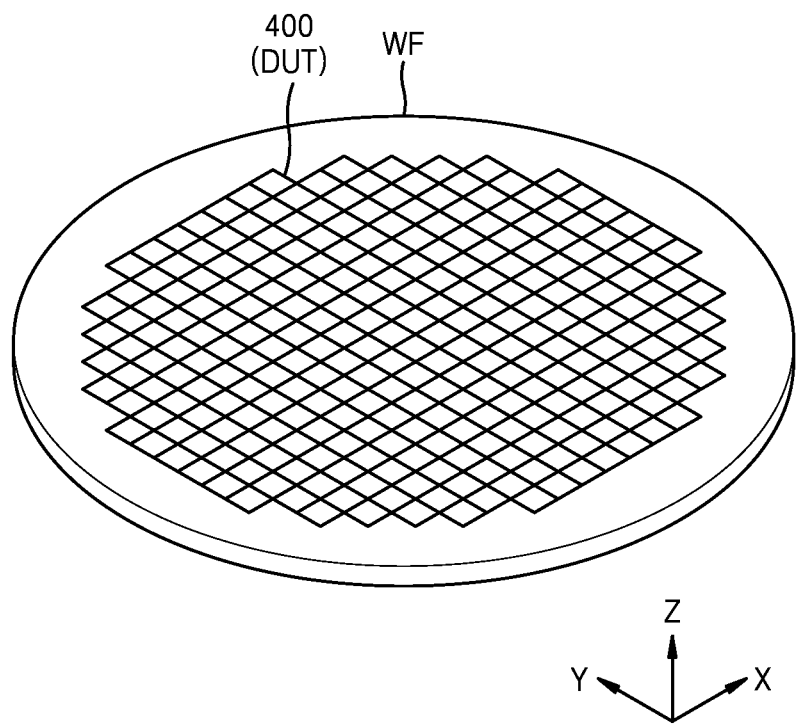
FIG. 7 is a diagram illustrating a semiconductor wafer on which semiconductor devices which are DUTs are arranged according to an exemplary embodiment of the inventive concept.

FIG. 7 is a diagram illustrating a semiconductor wafer on which semiconductor devices which are DUTs are arranged according to an exemplary embodiment of the inventive concept.

Referring to FIG. 7, a plurality of semiconductor dies 400 manufactured by a semiconductor manufacturing process may be arranged in an array on a semiconductor wafer WF, and may be DUTs in a wafer-level test.

The semiconductor wafer WF may be a silicon (Si) wafer. The semiconductor wafer WF may include a semiconductor element such as germanium (Ge) or a semiconductor compound such as silicon carbide (SiC), gallium arsenide (GaAs), indium arsenide (InAs), or indium phosphide. The semiconductor wafer WF may have a silicon-on-insulator (SOI) structure. For example, the semiconductor wafer WF may include a buried oxide (BOX) layer. The semiconductor wafer WF may include a conductive region, e.g., a well doped with impurities and/or a structure doped with impurities. In addition, the semiconductor wafer WF may include various device isolation structures such as a shallow trench isolation (STI) structure.

The semiconductor device 300 (see FIG. 1A) on which a test is performed may be the semiconductor die 400. The plurality of semiconductor dies 400 may include volatile memory devices or non-volatile memory devices. The volatile memory devices may be variously embodied as, for example, DRAM, SRAM, double data rate (DDR) DRAM, or the like. The non-volatile memory devices may be variously embodied as, for example, flash memory, phase-change RAM (PRAM), resistive RAM (RRAM), ferroelectric RAM (FRAM), or magnetic RAM (MRAM). Each of the plurality of semiconductor dies 400 may be provided with a contact pad for electrically connecting an internal circuit to an external device.

Figure 8:
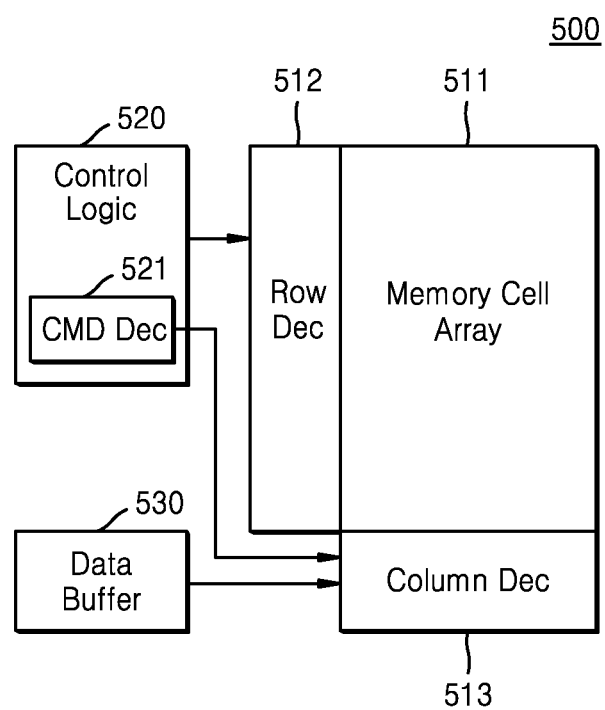
FIG. 8 is a block diagram illustrating a semiconductor device which is a DUT embodied as a memory device according to an exemplary embodiment of the inventive concept.

FIG. 8 is a block diagram illustrating a semiconductor device which is a DUT embodied as a memory device according to an exemplary embodiment of the inventive concept.

Referring to FIG. 8, a memory device 500 may include a memory cell array 511, a row decoder 512, and a column decoder 513 for memory operations to store and read data, and may further include a control logic 520 for control of overall operations of the internal components of the memory device 500, and a data buffer 530 for temporarily storing input/output data.

The control logic 520 may control the memory operations according to various signals from a memory controller. For example, the control logic 520 may receive an address from the memory controller, provide the row decoder 512 with a row address for selecting word lines of the memory cell array 511, and provide the column decoder 513 with a column address for selecting bit lines of the memory cell array 511. The control logic 520 may further include a command decoder 521 which decodes a command from the memory controller and controls internal operations of the memory device 500.

The semiconductor device 300 (see FIG. 1A) on which a test is performed may be the memory device 500. In exemplary embodiments of the inventive concept, information corresponding to a command/address from a test logic and information corresponding to data may be provided as test inputs to the memory device 500 in a test environment for the memory device 500. In the test environment for the memory device 500, an input voltage may be provided as an operating voltage to a target internal circuit of the memory device 500 through the DC-DC converter 211 (see FIG. 1A).

In addition, in the test environment for the memory device 500, the memory device 500 may perform signal processing using a test input, generate a test output as a result of the signal processing, and provide the test output to an external test logic.

Figure 9:
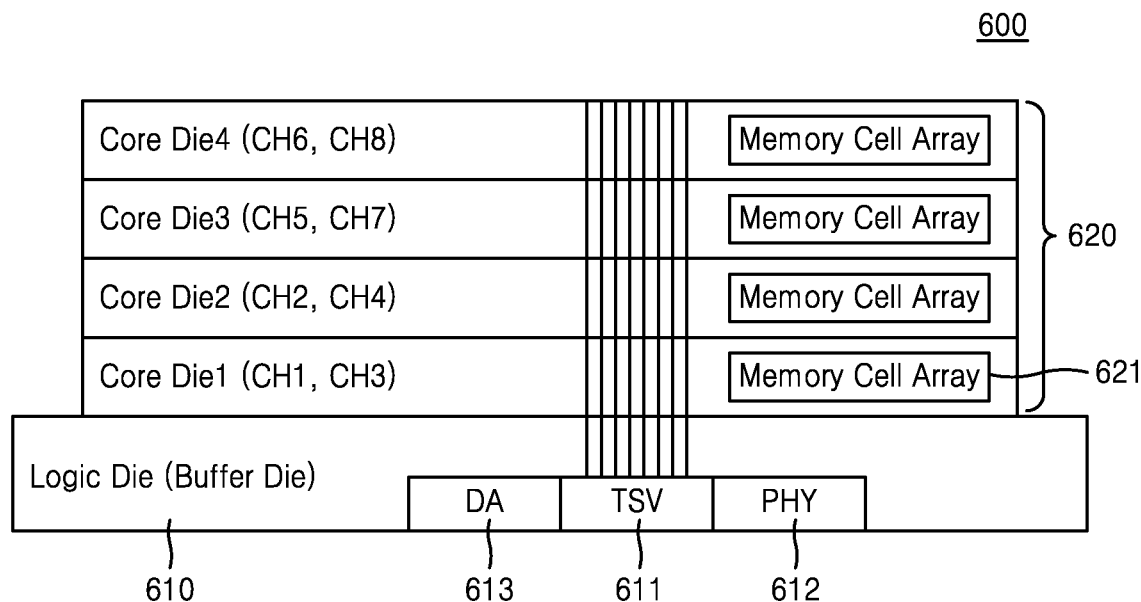
FIG. 9 is a diagram illustrating a semiconductor device which is a DUT embodied as a semiconductor package according to an exemplary embodiment of the inventive concept.

FIG. 9 is a diagram illustrating a semiconductor device which is a DUT embodied as a semiconductor package according to an exemplary embodiment of the inventive concept.

Referring to FIG. 9, a semiconductor package 600 may include a plurality of semiconductor dies. The plurality of semiconductor dies may include at least one core die 620 and a logic die 610. The at least one core die 620 may include a memory cell array 621.

The semiconductor package 600 may include a plurality of channels CH1 to CH8 with independent interfaces to increase a bandwidth thereof. The number of the at least one core die 620 and the number of channels CH1 to CH8 included in the semiconductor package 600 may be variously changed.

The logic die 610 may include a through-silicon-via (TSV) region 611, a physical region 612, and a direct access region 613. The logic die 610 may further include a control logic for controlling overall operations of the internal components of the semiconductor package 600, and may control the internal components in response to commands from an external controller.

The TSV region 611 corresponds to a region where TSVs are provided for communication with the at least one core die 620. The physical region 612 may include a plurality of input/output circuits for communication with the external controller. The direct access region 613 may communicate with the test server TS (see FIG. 4) via a conductive means on an outer surface of the semiconductor package 600 in a test conducted on the semiconductor package 600. Various signals provided from the test server TS may be provided to the at least one core die 620 via the direct access region 613 and the TSV region 611. Power supplied from the test server TS may be converted into an operating voltage by the DC-DC converter 211 (see FIG. 1A), and the operating voltage may be provided to the direct access region 613. The operating voltage may be provided to the at least one core die 620 via the TSV region 611.

In an exemplary embodiment of the inventive concept, the semiconductor package 600 may be mounted on the DUT board 201 (see FIG. 1A) to receive a test input, and a plurality of semiconductor packages 600 may be mounted on the plurality of DUT boards 201 (see FIG. 1A).

Figure 10:
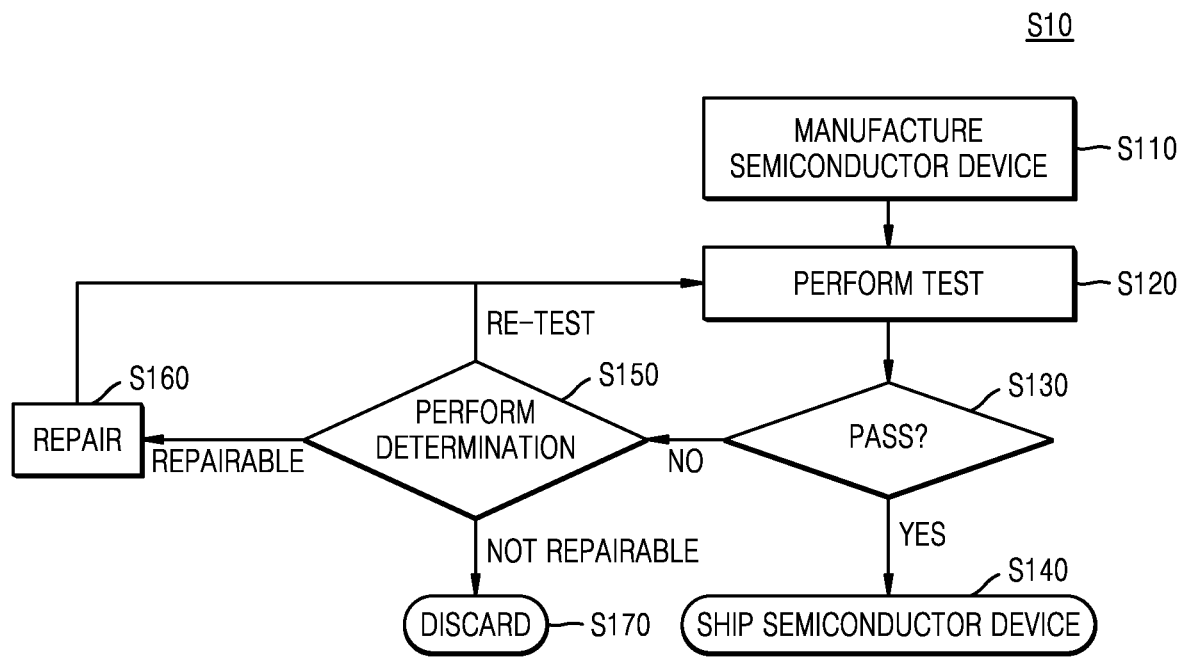
FIG. 10 is a flowchart of a test method of a test system according to an exemplary embodiment of the inventive concept.

FIG. 10 is a flowchart of a test method of a test system according to an exemplary embodiment of the inventive concept.

Referring to FIG. 10, a test method S10 of a test system may include the first through seventh operations S110 through S170 described below. According to exemplary embodiments of the inventive concept, certain operations may be performed in an order different from that described below depending on implementation. For example, two operations described consecutively may be performed substantially concurrently or in an order reversed from that described below.

First, a first operation (S110) manufactures a semiconductor device. A process of manufacturing a semiconductor device will be described in detail. First, a semiconductor wafer is prepared to manufacture a semiconductor device. The semiconductor device may include, for example, a system large-scale integration (LSI), flash memory, DRAM, SRAM, EEPROM, PRAM, MRAM, or RRAM.

Thereafter, a device isolation structure for defining a conductive region and an active region is formed on the semiconductor wafer. Semiconductor elements including various types of individual elements are formed on the semiconductor wafer with an active region defined by the device isolation structure. The individual elements may include various types of microelectronic elements, e.g., a MOS field-effect transistor (MOSFET) such as a complementary metal-oxide semiconductor (CMOS) transistor, an image sensor such as a CMOS image sensor (CIS), a system LSI, a micro-electro mechanical system (MEM), an active element, a passive element, or the like.

The individual elements may be electrically connected to the conductive region. The semiconductor elements may include at least two individual elements among the above individual elements, conductive interconnections electrically connecting the at least two individual elements and the conductive region, and/or a conductive plug. Each of the individual elements may be electrically separated from other neighboring individual elements by an insulating film. The semiconductor elements may include various circuit elements for driving the individual elements. The semiconductor elements may further include metal interconnections for electrically connecting the individual elements and the circuit elements, such as metal vias and/or an intermetallic insulating film.

After the semiconductor elements are formed on the semiconductor wafer, the individual semiconductor elements are separated and packaged to form a semiconductor device. The semiconductor device may include a contact pad to be connectable to a DUT board.

The semiconductor device may be a semiconductor package which includes a plurality of semiconductor elements, e.g., a plurality of semiconductor dies. In exemplary embodiments of the inventive concept, the semiconductor device may include a plurality of homogeneous semiconductor dies. Alternatively, the semiconductor device may include a plurality of heterogeneous semiconductor dies.

In exemplary embodiments of the inventive concept, the semiconductor device may be a semiconductor package, such as a package-on-package (PoP), a chip-scale package (CSP), a die-in-wafer pack, a die-in-wafer form, a chip-on-board (CoB), a system-in package (SiP), a multi-chip package (MCP), a wafer-level fabricated package (WFP), or a wafer-level processed stack package (WSP).

A second operation (S120) performs a test on the semiconductor device. The test performed on the semiconductor device may include, for example, the burn-in test, the DC test, the AC test, or the function test. The semiconductor device is connected to a test socket of the DUT board so as to perform the test on the semiconductor device. The DUT board may receive an operating voltage, a control signal, and/or a test pattern command from a test server via a board substrate, and perform the test on the semiconductor device.

After connecting a plurality of DUT boards to a plurality of test boards, the test may be simultaneously performed on a plurality of semiconductor devices. A result of performing the test on each of the plurality of semiconductor devices connected to the plurality of test boards may be transmitted to the test server. Each of the semiconductor devices on the plurality of DUT boards may be supplied with the operating voltage from a DC-DC converter.

A third operation (S130) checks whether the result of the test is a 'pass'. When the semiconductor device passes the test (S130: YES), a fourth operation (S140) ships the semiconductor device to be supplied to the market, thus completing the test method. The semiconductor device passing the test may be separated from the DUT board and supplied to the market. On the other hand, when the semiconductor device fails the test (S130: NO), a fifth operation (S150) performs a determination of whether the semiconductor device failing the test is to be re-tested or repaired.

The determination may be made by analyzing the result of the test. For example, retesting may be performed when it is determined that the test board and/or the DUT board is defective or when the result of the test is not clear. When retesting is performed, the test board and/or the DUT board may be replaced as needed.

Alternatively, when the result of the test reveals that the semiconductor device is repairable, a sixth operation (S160) repairs the semiconductor device, and then the semiconductor device may be retested. When it is determined that the semiconductor device is not repairable or when the semiconductor device has failed the test even when retested, a seventh operation (S170) discards the semiconductor device, thus completing the test method.

In the test board 10 of a test system according to an exemplary embodiment of the inventive concept, substantially the same operating voltages may be substantially simultaneously provided to semiconductor devices on a plurality of DUT boards, which consume a large amount of power in a test environment. Thus, power supplied from the test system may be losslessly used. As a result, characteristics of the semiconductor devices may be prevented from being deteriorated due to a test even in an extreme test environment such as a burn-in test.

In the test method (S10) of a test system according to an exemplary embodiment of the inventive concept, even when overcurrent flows through some of the semiconductor devices on DUT boards connected to one transmission line, a plurality of DC-DC converters may constantly provide substantially the same operating voltages to the remaining semiconductor devices.

While the inventive concept has been shown and described with reference to exemplary embodiments thereof, it will be understood by those of ordinary skill in the art that various changes in form and details may be made thereto without departing from the spirit and scope of the inventive concept as set forth by the appended claims.

What is claimed is:

1. A test board comprising:
   a board substrate;
   a connector at a side of the hoard substrate;
   a plurality of device-under-test (DUT) boards which are connected to the board substrate and on which semiconductor devices are mounted as DUTs; and
   a plurality of DC-DC converters connected to the plurality of DUT hoards,
   wherein the total number of the plurality of DC-DC converters is equal to the total number of the plurality of DUT boards, wherein the plurality of DC-DC converters convert an input voltage supplied thereto via the connector into operating voltages, and provide the operating voltages to the semiconductor devices on the plurality of DUT boards corresponding thereto, and
wherein the operating voltages are substantially the same.

2. The test board of claim 1, wherein
the plurality of DC-DC converters comprise step-down converters, and convert the input voltage supplied thereto into the operating voltages that are lower than the input voltage and provide the operating voltages to the semiconductor devices on corresponding DUT boards.

3. The test board of claim 1, further comprising a test controller on the board substrate,
wherein the test controller controls the plurality of DC-DC converters to convert the input voltage into the operating voltages.

4. The test board of claim 1, further comprising a plurality of transmission lines arranged on the board substrate,
wherein DUT boards of the same group among the plurality of DUT boards are connected in parallel to one of the plurality of transmission lines.

5. The test board of claim 4, wherein when overcurrent flows through some of the semiconductor devices on the DUT boards of the same group, the plurality of DC-DC converters constantly provide the operating voltages to the remaining semiconductor devices on the DUT boards of the same group.

6. The test board of claim 1, wherein
each of the plurality of DUT boards comprises an upper surface on which one of the semiconductor devices is mounted and a lower surface facing the board substrate, and
each of the plurality of DC-DC converters is provided on the upper surface of one of the plurality of DUT boards.

7. The test board of claim 1, wherein
each of the plurality of DUT boards comprises an upper surface on which one of the semiconductor devices is mounted and a lower surface facing the board substrate, and
each of the plurality of DC-DC converters is provided on the lower surface of one of the plurality of DUT boards.

8. The test board of claim 1, wherein
the plurality of DUT boards are provided on an upper surface of the board substrate, and
the plurality of DC-DC converters are provided on the upper surface of the board substrate to be spaced apart from the plurality of DUT boards.

9. The test board of claim 1, further comprising
a plurality of attachment and detachment members configured to attach the plurality of DUT boards to the board substrate or detach the plurality of DUT boards from the board substrate.

10. A test system comprising:
test equipment including a test chamber; and
a plurality of test boards configured to be supplied with an input voltage from the test equipment, and arranged in a test chamber,
wherein each of the plurality of test boards comprises:
a board substrate;
a connector at a side of the board substrate;
a plurality of device-under-test (DUI) boards which are connected to the board substrate and on which semiconductor devices are mounted as DUTs; and
a plurality of DC-DC converters connected to the plurality of DUT boards,
wherein the total number of the plurality of DC-DC converters is equal to the total number of the plurality of DUT boards,
wherein the plurality of DC-DC converters convert an input voltage supplied thereto from the test equipment via the connector into operating voltages, provide the operating voltages to the semiconductor devices on the plurality of DUT boards corresponding thereto, generate a test input to be provided to the semiconductor devices on the plurality of DUT boards, and identify whether the semiconductor devices are defective, based on test outputs of the semiconductor devices, and
wherein the operating voltages are substantially the same.

11. The test system of claim 10, wherein until the test outputs are provided to the test equipment, the test chamber maintains a certain temperature for a burn-in test.

12. The test system of claim 11, wherein the plurality of test boards substantially simultaneously perform the burn-in test on the semiconductor devices.

13. The test system of claim 10, wherein the plurality of DC-DC converters comprise step-down converters, and convert the input voltage supplied thereto from the test equipment into the operating voltages that are lower than the input voltage.

14. The test system of claim 13, wherein when overcurrent flows through some of the semiconductor devices on the plurality of DUT boards, the plurality of DC-DC converters constantly provide the operating voltages to the remaining semiconductor devices on the plurality of DUT boards.

15. The test system of claim 10, wherein,
in each of the plurality of test boards, each of the plurality of DUT boards comprises an upper surface on which one of the semiconductor devices is mounted and a lower surface facing the board substrate, and
each of the plurality of DC-DC converters is provided on the upper surface of one of the plurality of DUT boards.

16. The test system of claim 10, wherein,
in each of the plurality of test boards, each of the plurality of DUT boards comprises an upper surface on which one of the semiconductor devices is mounted and a lower surface facing the board substrate, and
each of the plurality of DC-DC converters is provided on the lower surface of one of the plurality of DUT boards.

17. The test system of claim 10, further comprising a plurality of attachment and detachment members configured to attach the plurality of DUT boards to the board substrate or detach the plurality of DUT boards from the board substrate.

18. The test system of claim 10, wherein the semiconductor devices comprise semiconductor dies or a semiconductor package.

* * * * *